(12) United States Patent
Noda et al.

(10) Patent No.: US 6,431,882 B1
(45) Date of Patent: Aug. 13, 2002

(54) CONNECTOR WITH TWO ROWS OF TERMINALS HAVING TAIL PORTIONS WITH SIMILAR IMPEDANCE

(75) Inventors: Atsuhito Noda, Hachioji; Tetsuo Hoshino; Toshihiro Niitsu, both of Yokohama; Tetsuya Asakawa, Machida, all of (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/720,601

(22) PCT Filed: Aug. 11, 1999

(86) PCT No.: PCT/US99/18290

§ 371 (c)(1),
(2), (4) Date: Dec. 22, 2000

(87) PCT Pub. No.: WO00/10228

PCT Pub. Date: Feb. 24, 2000

(30) Foreign Application Priority Data

Aug. 13, 1998 (JP) .............................................. 10-242576

(51) Int. Cl.$^7$ .............................................. H01R 12/00
(52) U.S. Cl. .......................................... 439/79; 439/83
(58) Field of Search ...................... 439/79, 83

(56) References Cited

U.S. PATENT DOCUMENTS 4,392,705 A * 7/1983 Andrews, Jr. et al. ........ 439/79
4,628,410 A   12/1986 Goodman et al.
5,439,385 A * 8/1995 Sakai et al. ................... 439/79
5,490,786 A * 2/1996 Mosquera et al. ............ 439/79

FOREIGN PATENT DOCUMENTS

DE   3412700      10/1985
EP    059350      3/1993
JP   3-134973   *  6/1991      ................. 439/83

* cited by examiner

*Primary Examiner*—Tho D. Ta
(74) *Attorney, Agent, or Firm*—Thomas D. Paulius; Charles S. Cohen

(57) ABSTRACT

An improved electrical connector has a series of terminals arranged in two parallel rows in the connector housing, with the terminals being separated into upper and lower levels. The tail portions of the upper terminals have intermediate portions that are bent down to descend obliquely from the rear side of the connector housing while the tail portions of the lower terminals have corresponding intermediate portions that are bent up to rise obliquely from the rear side of the connector housing. The intermediate portions of the upper and lower rows of terminals meet with the solder tail portions of the tail portions along a common length so that the tail portions of both upper and lower rows have the same electrical length. The intermediate portions of both rows of terminals are also tapered, or flared along their length so that they have a larger surface area where they exit the connector housing than where they join to their associated solder tail portions. This tapering also assists in maintaining a desired impedance of the connector tail.

27 Claims, 3 Drawing Sheets

FIG. I
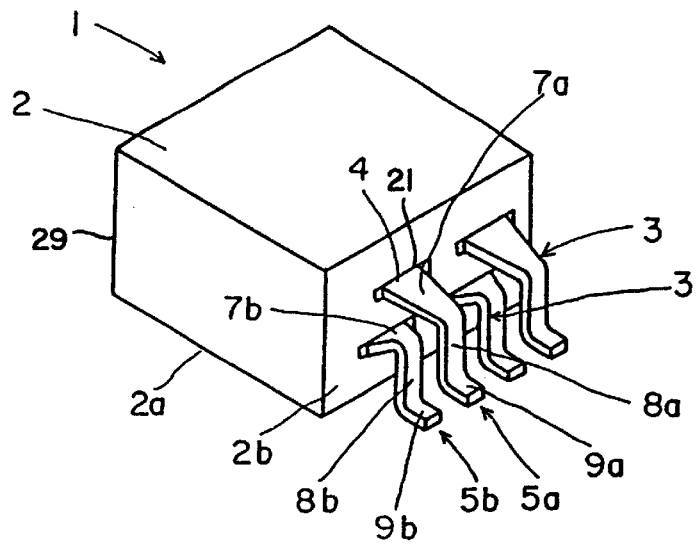
FIG. 2
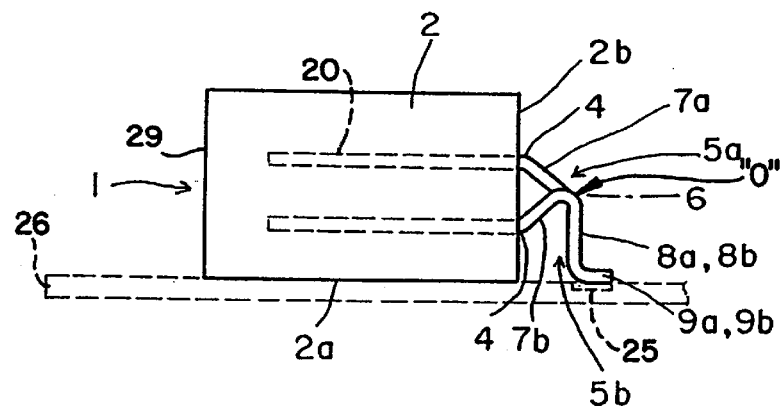
FIG. 3
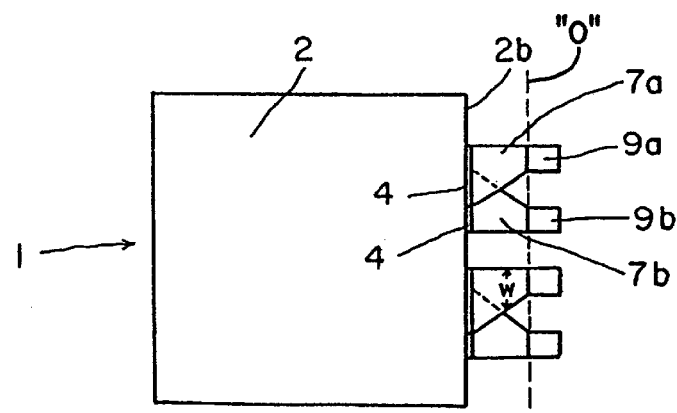

CONNECTOR WITH TWO ROWS OF TERMINALS HAVING TAIL PORTIONS WITH SIMILAR IMPEDANCE

BACKGROUND OF THE INVENTION

The present invention relates to an electrical connector appropriate for use in transmitting high-frequency signals, and more particularly to a connector having terminals of substantially the same impedance.

In electronic applications that utilize high-frequency signals, it is desirable that the signal paths for such signals be optimized so as to control the resistance, capacitance and inductance which, in concert, affect the overall impedance of the signal paths. It is desirable to control the impedance of the signal path in order to prevent the degradation of the signals, especially high-frequency signals that traverse the signal path. Impedance may be easily controlled in electronic cables due to their construction, but it is more difficult to control in connectors because of the arrangement and structure of the conductive terminals of the connector. The spacing of the terminals must be taken into account, as well as their shape and also the dielectric material used for the connector housing.

FIG. 6 illustrates a conventional electric connector 50 that has a plurality of terminals 54 mounted in an insulative housing 51. The terminals are arranged in two parallel rows (shown as upper and lower) that extend in the direction (lengthwise) in which an opposing connector is inserted. These terminals 54 have contact portions (not shown) that are disposed in the connector housing 51 and tail portions 52 that extend out of the connector into position for surface mount soldering to a circuit board. The tails 52 of these terminals have different tail sections 52a and 52b because the upper and lower terminals are bent so as to form "L"-shaped, vertical leg and horizontal foot extensions. The horizontal foot extensions 53 are arranged to be flush with the bottom 51a of the insulative housing 51, thus permitting the horizontal foot extensions 53 to be used as soldering tails so that the terminals 54 may be soldered to opposing pods or traces on the circuit board.

As seen in FIG. 6, the vertical tail sections 52a and 52b of the upper and lower terminals differ in their lengths. The difference in these two lengths also effects the "electrical" length of the upper and lower paired terminals and so cause an adverse effect on high-frequency signals traveling on a transmission path through this connector. This conventional structure promotes a drastic change in the impedance of the terminals where they exit the connector.

In order to lessen the difference of the impedance change, attempts have been made to make the tail sections 52a and 52b of the upper and lower terminals have the same length. As shown in FIG. 7, the tail sections 52a and 52b of the upper and lower terminals are formed to have the same length. However, because the tail sections 52a and 52b are arranged in two parallel rows in the connector housing 51, they must be bent at four different locations as shown to compensate for the different vertical distances from the lower and upper levels. This provides terminal tail sections of the same electrical length, as seen in FIG. 7. This is shown in Japanese Laid-Open Patent Application No. 6-60946.

Although the same length of the terminal tail sections, 52a, 52b of such connectors causes no adverse effect on the high-frequency signals transmitted therethrough, the work required to bend and form these terminals is complicated, and there exists difficulty in putting all of the terminal tail ends in a coplanar relation relative to the surface of the printed circuit board. This is due to an increased amount of springback in each tail section caused by the numerous bends that are complex or right-angle bends. This type of structure lowers the reliability with which the terminal tail ends can be soldered to selected conductors in a printed circuit board.

Accordingly, the present invention is directed to a connector having an improved terminal tail structure that overcomes the aforementioned disadvantages and provides improved electrical characteristics to the connector.

SUMMARY OF THE INVENTION

It is therefore a general object of the present invention to provide a connector in which terminal tail portions have the same length and which have a structure that facilitates their attachment to a circuit board.

Another object of the present invention is to provide a connector having two rows of terminals arranged in upper and lower rows in a connector housing, in which the terminals of the two rows have same electrical length, and are formed in a manner that facilitate the bending of the terminal tail sections.

Yet another object of the present invention is to provide a connector for surface mount applications with improved impedance characteristics wherein the connector includes a plurality of conductive terminals having contact portions disposed in the connector housing, tail portions exiting from the housing, the tail and contact portions being interconnected by respective intermediate portions, the terminal tail and intermediate portions of the two rows of terminals having substantially the same electrical length and being oriented in opposing directions.

Still yet another object of the present invention is to provide a connector with improved electrical impedance characteristics in which the connector has a connector housing that houses a plurality of terminals, the terminals being arranged in at least two horizontal discrete rows of terminals, with the terminals further being arranged in discrete pairs of terminals between the two rows of terminals so that each discrete terminal in one row of terminals is associated with another discrete terminal in the other row of terminals, the discrete terminals of the one row having intermediate portions that slope downwardly to their tail portions and the discrete terminals of the other row of terminals having intermediate portions that slope upwardly to their tail portions, the opposing sloping portions of both terminal rows meeting their respective tail portions along a common line so that the electrical length of the terminals in one row is substantially the same as the terminals in the other row, and wherein the terminal intermediate portions have widths hat vary along their length so as to achieve an impedance along the intermediate portions of discrete pairs of terminals that is substantially the same as that of the tail portions of the discrete pairs of terminals.

To attain these objects, a connector is provided in accordance with the present invention in which the tail sections of two rows of terminals exit from the rear face of the connector housing and the associated intermediate portions of the terminals being bent obliquely relative to the rear face of the connector housing. A plurality of conductive terminals are mounted in the connector housing of the connector. The terminals include discrete pairs of terminals are arranged at least two distinct rows, preferably in two upper and lower rows with one terminal in the upper row being associated with a specific terminal in the lower terminal row.

The terminals extend longitudinally out of the connector housing. The intermediate portions of the upper row of terminals are bent downward from the rear face of the connector housing to where they meet their associated tail portions, and the tail sections of the lower row of terminals are bent upward from the rear face of the connector housing. The intermediate portions of the terminals of the upper and lower row meet with their associated tail portions along a common line. This bending arrangement of the intermediate portions of the terminals places the solder tail portions in a coplanar relationship with the bottom face of the connector housing, thereby permitting the solder tail portions to be soldered to selected conductors on a circuit board.

The small number of bends is easy to accomplish and it also reduces the total amount of springback in each terminal tail section. The solder tail portions may be arranged to be flush with the bottom of the connector housing thereby permitting required soldering to be performed on their surfaces. Alternatively, the solder tail portions may be vertical tails that can be inserted and soldered in selected through holes in a printed circuit board.

Each of the oblique, or sloping, portions of the terminal tail sections may have a width that preferably taper along their lengths toward their associated solder tail portions so that the surface area of the terminals is greater near the rear face of the connector housing which subsequently reduces along the length of the intermediate portions until they reach they associated tail portions. Thus, the upper and lower rows of terminals have a similar impedance as they exit out of the connector to thereby improve the transmitting performance for high-frequency signals.

These and other objects and advantages of the present invention will be clearly understood from the following detailed description.

BRIEF DESCRIPTION OF THE DRAWINGS

In the course of the following detailed description, reference will be made to the accompanying drawings in which:

FIG. 1 is a perspective view of the rear face of a connector constructed in accordance with the principles of one embodiment of the present invention;

FIG. 2 is an end view of the connector of FIG. 1;

FIG. 3 is a top plan view of the connector of FIG. 1;

DETAILED DESCRIPTION OF THE PREFERRED EMBODIMENTS

Figure 4:
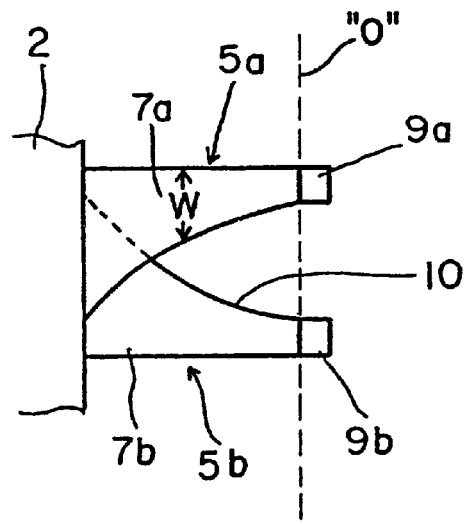
FIG. 4 is an enlarged, partial top plan view of another embodiment of a connector constructed in accordance with the principles of the present invention.

Referring now to FIGS. 1 to 3, a first embodiment of a connector 1 constructed in accordance with the principles of the present invention is illustrated as having a plurality of conductive terminals 3 mounted in an insulative connector housing 2. The connector 1 has a mating face 29 that is adapted to mate with an opposing connector (not shown). The terminals 3 are seen to be arranged in two generally parallel rows at upper and lower levels. These terminals extend longitudinally out from the connector housing 2 in the direction in which an opposing connector is inserted.

Each terminal 3 may be made by stamping it from a thin metal sheet with dies. Each terminal has a male or female contact portion 20 (shown in phantom in FIG. 2) formed at one end, an intermediate retaining portion 4 consecutive to the male or female contact portion 20, and a tail portion 5a, 5b formed at the other end, and also consecutive to the intermediate retaining section 4. When the terminal 3 is inserted in a selected terminal slot 21 formed in the rear side 2b of the connector housing 2, the terminal 3 is secured in the rear wall 2b of the connector housing 2 by the intermediate retaining portion 4, thereby allowing the male or female contact portion to project lengthwise in the connector housing 2. At the same time, the tail portion 5a or 5b extends rearwardly from the rear face 2b of the connector housing 2 (shown to the right in FIGS. 2 and 3).

As seen in FIGS. 2 and 3, the intermediate portions 7a of the upper row of terminals also project from the rear face 2b of the connector housing 2 and are bent at an angle (obliquely, with respect to the rear face 2b of the connector housing 2) downwardly to where they join their associated tail portions 5a. Similarly, the intermediate portions 7b of the lower row of terminals are bent at an angle upwardly to join their associated tail portions 5b. As seen best in FIG. 2, the two planes in which the intermediate portions of the upper and lower terminals lie intersect each other at point "O" that is shown generally at 6 in FIG. 3. This point O may also be considered as a common line that extends transversely to the terminals 3 and separates the intermediate portions 7a, 7b from their associated vertical leg portions 8a, 8b.

The tail portions 5a of the upper terminal row are generally L-shaped with vertical legs 8a and horizontal feet 9a. The tail portions 5b of the lower terminal now are also generally L-shaped with associated legs 8b and horizontal feet 9b. The mounting feet 9a, 9b preferably lie in the same plane and are also preferably generally flush with, or slightly beneath the bottom face 2a of the connector housing 2, to thereby act as solder tails for attachment to opposing conductive pads 25 on a circuit board 26, shown in phantom.

As mentioned above, the upper and lower terminals 3 are paired together vertically for use, and each pair of terminals has same characteristic impedance as the other pair of terminals. With this pairing, a single terminal 5a of the upper row of terminals is associated with a single terminal 5b of the lower row of terminals. Thus, this pair of terminals may be connected to a differential pair of another electronic component or device by way of an opposing connector (not shown). As seen best in FIGS. 1 and 3, the terminals of each such pair are offset from each other in the horizontal direction. As seen in the embodiment of FIG. 3, the oblique, or sloping, extensions 7a and 7b have a width "W" that tapers, or reduces down in a gradual manner to the width of the tail portions 5a, 5b that occur at the point where the intermediate portions join with the tail portions, shown at 6 in FIG. 2. The characteristic impedance of the paired terminals varies proportionally to the terminal-to-terminal distance, and inversely proportionally to the confronting terminal area.

Figure 7:
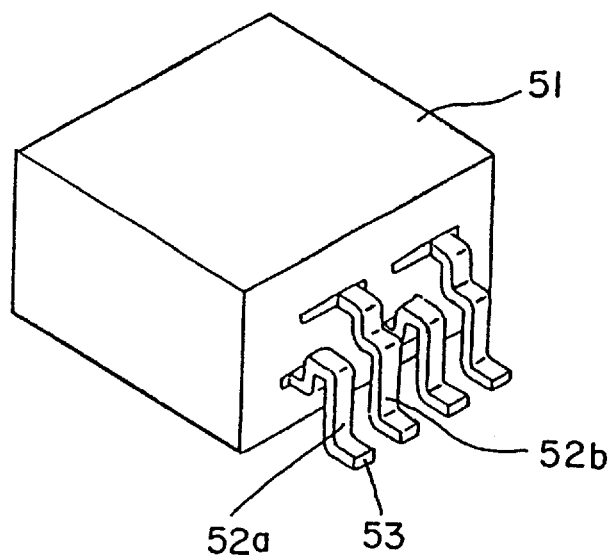

It can thus be seen that the intermediate and tail portions of each terminal 3 are bent at three different places, and one of the angles is an obtuse angle. Thus, the required bending work is not especially complex compared to the terminals shown in FIG. 7. Moreover, the small number of bends reduces the amount of springback as compared to the known terminal structures of FIG. 7. Springback, as used herein, is the inherent property of most metals that occurs when a metal shape is being bent. The material has a tendency to "spring back" toward its original shape. The more bends that are present in a terminal such as the prior art terminal shown in FIG. 7, the greater the difficulty in controlling the tolerances (i.e., the location of the flat tail portions 9a, 9b) because each bend has springback associated therewith. The reduced springback of the connectors of the present invention increases the likelihood that he solder tails 9a and 9b will lie flush with the bottom face 2a of the connector 2, thus permitting the soldering tails 9a and 9b to be put exactly on selected conductors 25 of the circuit board 26. Thus, the required soldering can be effected with an increased reliability.

Each pair of terminals has substantially the same characteristic impedance, and therefore, a transmission line using the connectors of the invention will be free of reflection and loss of high-frequency signals traveling along the transmission line. The connectors of the invention are thus most appropriate to use with differential pairs of wires or other differential conductors. For any given differential pair, one conductor of the pair will carry current flow in one direction while the other conductor of the pair will carry an equal current flow in the opposite direction. The current flows in each of these wires will generate its own electromagnetic field, whose orientation is dependent on the flow of current through the conductor. These differential pairs are contained in a cable and in the opposing connector that mates with the connector of FIGS. 1–3 at its front face 1.

Current will flow in the connector terminals 5a, 5b in the same direction as it flows in the associated differential pairs of the opposing mating connector. For example, the left terminal of the top row may have a voltage out or positive terminal while its associated lower row terminal would be a voltage return or negative terminal. In any event, each terminal will generate an electrical field. These fields oppose each other and will have a canceling effect on the other to substantially suppress radiated emissions from the terminals. The line along which this canceling occurs is considered a "virtual" ground because the potential of the electric fields are zero at that point.

The angles of the intermediate sections assist in both reducing the springback of the tail portions and keeping the terminals the same length. Because the tail portions of the terminals are also of the same length, the pairs of terminals 5a and 5b have the same electrical length. This assists in maintaining the pairs of terminals at the same impedance. The tapering width of the terminal intermediate portion also assists in this function. The terminal intermediate portions 7a, 7b are wider near the rear face of the connector housing and become narrower gradually (depicted as a linear reduction in FIG. 3) until they match the width of the tail portions 8a–b and 9a–b. As they taper in their widths, the distance between them is reduced until at the point O at 6 in FIG. 2, the taper is eliminated and the intermediate portions join the vertical leg portions 8a, 8b such that all of the terminals of the connector are now in side-by-side order.

The effect of this terminal structure, including the gradual tapering, is that the impedance of the terminals is maintained to the point O. This is due in part to the large width, and hence, greater surface area of the two terminal intermediate portions 7a, 7b near the rear face of the connectors that increases the capacitance of the pairs of terminals at the rear face of the connector 2. This capacitance decreases as the spacing between the terminal intermediate portions 7a, 7b (and the widths thereof) decreases to a level at point O where the terminal intermediate portions join the vertical legs 8a, 8b of the terminals. At this point the legs 8a, 8b and the feet 9a, 9b are arranged in a closer spacing in a side-by-side order. Thus, by tapering or flaring the width of the terminals along the intermediate portions 7a, 7b of the terminals 5a, 5b while bringing them toward each other at an angle to point O, the characteristic impedance of the terminals will likely be maintained at substantially the same levels.

The connector described above has its solder tails 9a and 9b flush with the bottom 2a of the connector housing 2, thereby permitting the solder tails 9a and 9b to be soldered on selected conductors in a printed circuit board. Alternatively, the solder tails may use vertical, throughhole pins in place of the L-shaped leg-and-foot extension, thereby permitting the solder tails to be inserted in throughholes in the circuit board for soldering. In this modification, each tail section is bent only at two selected places, thereby further reducing the needed bending.

Figure 5:
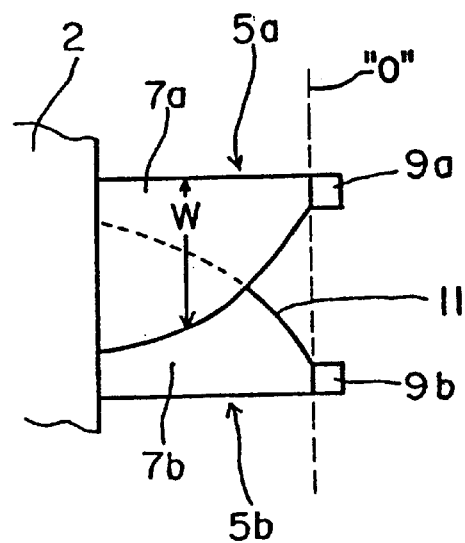
FIG. 5 is an enlarged, partial top plan view of a third connector embodiment constructed in accordance with the principles of the present invention.
Figure 6:
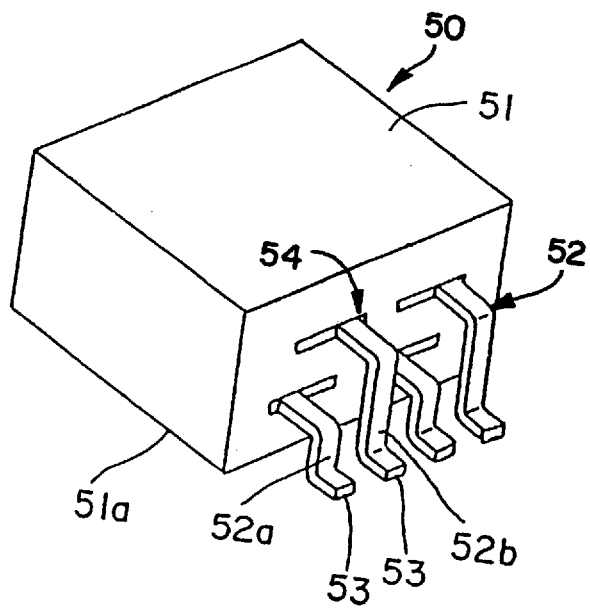
FIG. 6 is a perspective view taken from the rear of a conventional connector; and, FIG. 7 is a perspective view taken from the rear of another conventional connector.

The tapering of the tail intermediate portions need not be limited to the linear taper shown in FIG. 3. FIG. 4 illustrates another embodiment wherein the tapering is more of a "flared" configuration along at least one arcuate or curvilinear path, shown at 10 as extending in a concave manner inwardly. Likewise, FIG. 5 shows another embodiment where in the flaring occurs in an convex or outward manner along reference number 11.

It will be understood that the embodiments of the present invention which have been described herein are merely illustrative of some of applications of the principles of the present invention. Various modifications may be made by those skilled in the art, such as a different taper or flare configurations and other modifications without departing from the true spirit and scope of the invention.

What is claimed is:

1. A connector, comprising:

a connector housing having a body portion, the body portion including a mating face and a mounting face;

a plurality of conductive terminals disposed in the connector housing, said terminals being arranged in at least two discrete rows of terminals, the two discrete rows of terminals being spaced apart from each other a predetermined distance, each of said at least two discrete rows of terminals having the same number of terminals to define associated pairs of terminals, one terminal of said pair being present in one of said at least two discrete rows and the other terminal of said pair being present in the other of said at least two discrete rows;

each of the terminals including a contact portion and a tail portion, the contact portion being supported by said connector housing, the tail portion exiting from said connector housing body portion and including a solder tail portions for connection to a printed circuit board, and said tail portion further including an intermediate tail portion of predetermined length extending between said contact portion and said solder tail portion, each of said terminal intermediate portions having a width that varies along its length, the width of said terminal intermediate portions being approximately the same as a width of said solder tail portions and increasing as said terminal intermediate portions approach said connector mounting face.

2. The connector as defined in claim 1, wherein each of said terminal solder tail portions includes a mounting foot, and all of the mounting feet of said terminal solder tail portions are arranged approximately flush with a bottom surface of said connector housing.

3. The connector as defined in claim 1, wherein said first direction is downwardly and said second direction is upwardly with respect to said connector housing mounting face.

4. The connector as defined in claim 1, wherein said first and second rows of terminals exit from said connector housing mounting face in respective upper and lower terminal rows and terminals in said upper row are offset with respect to terminals in said lower row.

5. The connector as defined in claim 1, wherein said first plane of said terminal intermediate portions is a downward plane and said second plane of said terminal intermediate portions is an upward plane and said solder tail portions include vertical leg portions that are joined to said intermediate portions.

6. The connector as defined in claim 1, wherein said intermediate tail portions of said terminals of said one of said at least two discrete terminal rows extending from said connector housing mounting face in a first plane toward their associated solder tail portions, and said intermediate portions of said terminals of said other of said at least two discrete terminal rows extending from said connector housing mounting face in a second plane toward their associated solder tail portions, each of said intermediate terminal portions having the first and second planes intersecting each other along a line that coincides with the solder tail portions of both of said at least two discrete rows of terminals, such that the overall electrical length of said at least two discrete rows of terminal tail portions is substantially the same.

7. The connector as defined in claim 1, wherein said intermediate portions of said terminals of each of said at least two discrete terminal rows have a width that varies from said connector housing rear face to said terminal tail portions.

8. The connector as defined in claim 7, wherein said intermediate portions of said terminals of each of said at least two discrete terminal rows have a surface area that varies along their length, the surface area of said intermediate portions being greater proximate to said connector housing mounting face and being lesser proximate to said solder tail portions.

9. The connector as defined in claim 7, wherein said intermediate portions of each of said at least two discrete rows of terminals are tapered rearwardly along their length.

10. The connector as defined in claim 9, wherein said intermediate portions of said first and second terminal rows are tapered linearly along their length.

11. The connector as defined in claim 7, wherein said intermediate portions of each of said at least two discrete rows of terminals are flared rearwardly along their length.

12. The connector as defined in claim 11, wherein said intermediate portions of said first and second terminal rows are arcuately flared along their length.

13. The connector as defined in claim 12, wherein said arcuate flare is concave.

14. The connector as defined in claim 12, wherein said arcuate flare is convex.

15. A connector, comprising:

a connector housing, the connector housing having first and second faces separated by an intervening connector body portion;

a plurality of conductive terminals disposed in the connector housing and exiting from said connector housing along said connector housing second face, said terminals being arranged in two discrete rows of terminals, the two discrete rows of terminals being spaced apart from each other vertically along said connector housing second face to define an upper row of terminals and a lower row of terminals, each terminal of said upper row of terminals being associated with a corresponding single terminal in said lower row of terminals;

each of the terminals including a contact portion disposed within said connector housing, each of the terminals further including a tail portion for connecting said connector to a printed circuit board, each of the terminals further including an intermediate portion interposed between said contact portion and said tail portion which joins said contact and tail portions together, said intermediate and tail portions of each terminal being disposed outside of said connector housing;

said intermediate portions of said terminals of said upper terminal row extending downwardly at an angle in a first plane with respect to said connector housing second face, and said intermediate portions of said terminals of said lower terminal row extending upwardly at an angle in a second plane with respect to said connector housing second face, the first and second planes intersecting each other along an extent that coincides with where said intermediate portions of said terminals of both said upper and lower terminal rows respectively join their associated tail portions;

and, wherein said intermediate portions of each of said terminals of said upper and lower terminal rows has a predetermined length extending between said connector housing second face and its associated tail portion, each of said intermediate portions further having a width that varies along said length thereof, the width of said terminal intermediate portions being approximately the same as a width of said solder tail portions and increasing as the terminal intermediate portions approach said connector second face, such that said upper terminal row intermediate portions at least partially overlap said lower row terminal intermediate portions.

16. The connector as defined in claim 15, wherein said terminals in said upper terminal row are offset with respect to said terminals in said lower row.

17. The connector as defined in claim 15, wherein said terminal tail portions are surface mount tail portions.

18. The connector as defined in claim 15, wherein said intermediate portions of each of said upper and lower terminal rows are tapered rearwardly along their length.

19. The connector as defined in claim 18, wherein said intermediate portions of each of said upper and lower terminal rows are tapered linearly along their length.

20. The connector as defined in claim 15, wherein said intermediate portions of each of said upper and lower terminal rows are flared rearwardly along their length.

21. The connector as defined in claim 20, wherein said intermediate portions of each of said upper and lower second terminal rows are arcuately flared along their length.

22. The connector as defined in claim 21, wherein said arcuate flare is concave.

23. The connector as defined in claim 21, where in said arcuate flare is convex.

24. A connector, comprising:

a connector housing including distinct first and second faces;

a plurality of conductive terminals disposed in the connector housing and at least partly extending through said connector housing and exiting from said connector housing along said connector housing second face, said terminals being arranged in first and second rows of terminals spaced apart from each other along said connector housing second face;

each terminal including a contact portion, a tail portion for connecting said connector to a printed circuit board, each of the terminals further including an intermediate portion interposed between said contact portion and said tail portion which joins said contact and tail portions together, said intermediate and tail portions of each terminal being disposed outside of said connector housing;

said intermediate portions of said terminals of said upper terminal row extending at an angle in a first plane with respect to said connector housing second face, and said intermediate portions of said terminals of said second terminal row extending at an angle in a second plane with respect to said connector housing second face, the first and second planes intersecting each other along an extent coinciding approximately with locations where said intermediate portions of said terminals of both said upper and lower terminal rows respectively join their associated tail portions;

and, wherein said intermediate portions of each of said terminals of said first and second terminal rows have a length in their extent between said connector housing second face and their associated tail portions, each of said intermediate portions further having a width that varies along said length thereof, the widths of said terminal intermediate portions being approximately the same as widths of said solder tail portions and increasing as the terminal intermediate portions approach said connector housing second face, such that said upper terminal row intermediate portions at least partially overlap said lower row terminal intermediate portions.

25. The connector as defined in claim 24, wherein said first plane of said terminal intermediate portions is a downward plane and said second plane of said terminal intermediate portions is an upward plane.

26. A connector, comprising:

a connector housing, the connector housing having first and second faces separated by an intervening connector body portion;

a plurality of conductive terminals disposed in the connector housing and exiting from said connector housing along said connector housing second face, said terminals being arranged in two discrete rows of terminals, the two discrete rows of terminals being spaced apart from each other vertically along said connector housing second face to define an upper row of terminals and a lower row of terminals, said terminals including at least one associated pair of terminals, one terminal of said pair being disposed in the upper row of terminals and the other of said associated pair being disposed in said lower row of terminals;

each of said associated pair of terminals including a contact portion disposed within said connector housing, a tail portion for connecting to a printed circuit board and an intermediate portion extending between said contact and tail portions;

and, wherein said intermediate portions of said associated pair of terminals extend between said connector housing second face and their associated tail portions and each of said intermediate portions include a width that varies along said length thereof, the width being approximately the same as a width of said solder tail portions and increasing as the terminal intermediate portions approach said connector second face, such that one terminal intermediate portion of each of said associated terminal pair at least partially overlaps the terminal intermediate portion of the other of said terminals in said associated pair.

27. The connector as defined in claim 26, wherein one of said intermediate portions of said associated pair of terminal pair extends downwardly at an angle in a first plane with respect to said connector housing second face, and the other of said intermediate portions of said associated terminal pair extends upwardly at an angle in a second plane with respect to said connector housing second face, the first and second planes intersecting each other along an extent that coincides with where said intermediate portions of said associated terminal pair respectively join their associated tail portions.

* * * * *